United States Patent

Broadie et al.

[11] 3,963,538
[45] June 15, 1976

[54] TWO STAGE HETEROEPITAXIAL DEPOSITION PROCESS FOR GaAsP/Si

[75] Inventors: Robert W. Broadie, Hopewell Junction; Bernard M. Kemlage, Kingston; H. Bernard Pogge, Hopewell Junction, all of N.Y.

[73] Assignee: International Business Machines Corporation, Armonk, N.Y.

[22] Filed: Dec. 17, 1974

[21] Appl. No.: 533,604

[52] U.S. Cl. .................. 148/175; 156/610; 156/612; 156/613; 156/614; 357/16; 357/17; 357/60; 357/88
[51] Int. Cl.² .............. H01L 21/205; H01L 33/00
[58] Field of Search ........... 148/175; 156/610, 612, 156/613, 614; 357/16, 17, 60, 88

[56] References Cited
UNITED STATES PATENTS

| | | | |
|---|---|---|---|
| 3,433,684 | 3/1969 | Zanowick et al. | 357/16 X |
| 3,508,962 | 4/1970 | Manasevit et al. | 156/612 X |
| 3,699,401 | 10/1972 | Tietjen et al. | 357/16 X |
| 3,766,447 | 10/1973 | Mason | 148/175 X |
| 3,783,009 | 1/1974 | Tramposch | 148/175 X |
| 3,839,082 | 10/1974 | Kasano et al. | 148/175 X |
| 3,862,859 | 1/1975 | Ettenberg et al. | 148/175 X |

OTHER PUBLICATIONS

Broadie et al., "Selective Planar GaP/Si ... Diodes" I.B.M. Tech. Discl. Bull. vol. 16, No. 4, Sept. 1973. p. 1301.

Berkenblit et al., "Reduction of Stress ... Hetero-epitaxial Layers" IBID. vol. 12, No. 9, Feb. 1970, p. 1489.

Blum et al., "Vapor Growth of GaP onto Si Substrates" IBID., vol. 13, No. 5, Oct. 1970, p. 1245.

Ladany et al., "Two-Stage Epitaxial ... GaAs ... on Spinel", J. Applied Physics, vol. 43, No. 1, Jan. 1972, pp. 236–238.

*Primary Examiner*—L. Dewayne Rutledge
*Assistant Examiner*—W. G. Saba
*Attorney, Agent, or Firm*—Sughrue, Rothwell, Mion, Zinn & Macpeak

[57] ABSTRACT

A process for producing light emitting diodes is disclosed. In the process a primer layer of GaP is pyrolytically deposited on a Si substrate with the resulting epitaxial film thickness being sufficient to form complete coalescence of the epitaxial nuclei, but thin enough to avoid cracks in the epitaxial layer due to stress induced by thermal expansion. The thickness is generally between $0.1–10\mu$. A second layer of GaP is then deposited using the standard halide transport process with thicknesses of $2–5\ \mu$ or higher. In the case of GaP LED's the thickness is about $10–40\ \mu$, whereas for the case of GaAsP LED's the GaP thickness is $2–5\ \mu$ and this is then followed, through the addition of $AsH_3$, with GaAsP graded from the GaP composition to the particularly desired design composition. The final composition is then maintained for $10–20\ \mu$.

16 Claims, 4 Drawing Figures

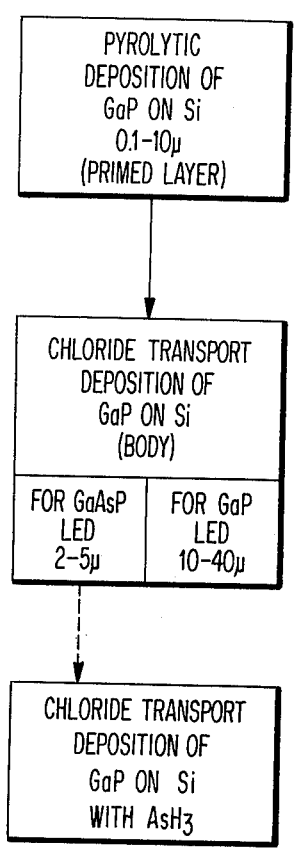
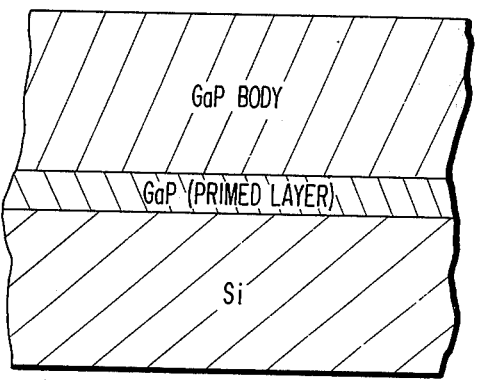
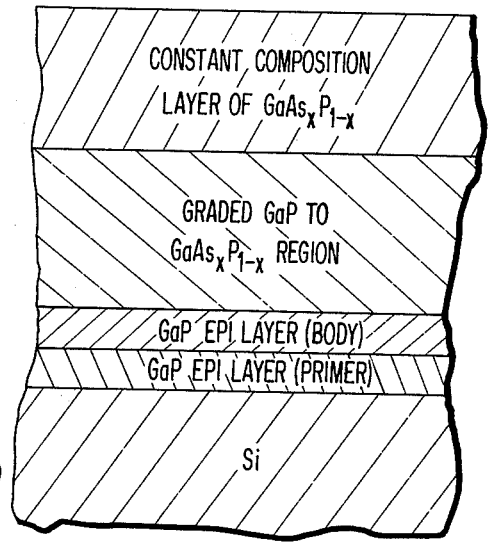
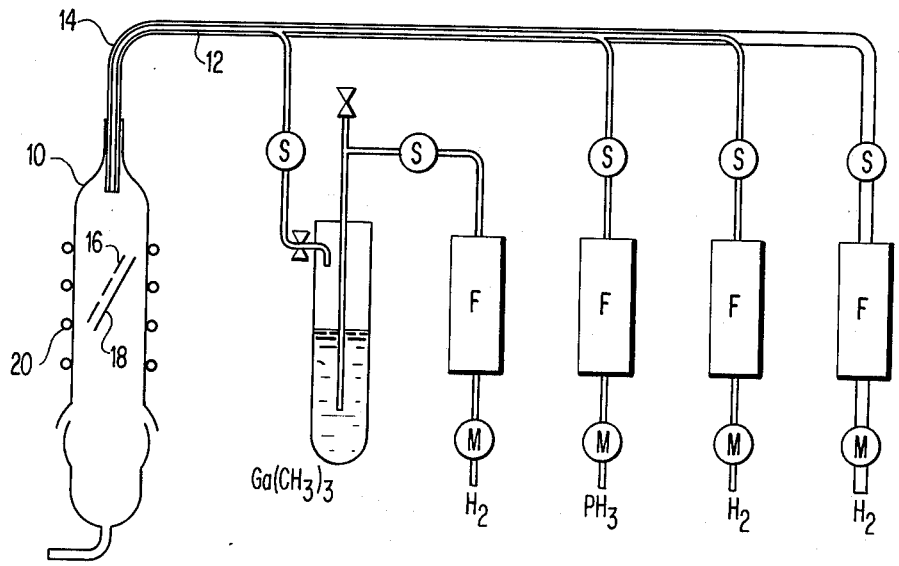

TWO STAGE HETEROEPITAXIAL DEPOSITION PROCESS FOR GAP/SI

BACKGROUND OF THE INVENTION

1. Field of the Invention

The invention disclosed and claimed herein is in the field of semiconductor devices and processes for the manufacture thereof. Specifically, the invention is directed toward the preparation of light emitting diodes (LED's) by the epitaxial growth of gallium phosphide (GaP) on silicon (Si) substrates.

2. Prior Art

The literature is replete with reports covering heteroepitaxial deposition studies encompassing various types of film-substrate systems and the structures produced have been generally intended for use in further examination of heterojunction devices such as heterodiodes, or for the fabrication of devices onto the epitaxial film. In the latter case, the substrate is normally chosen on a basis of economics or because of certain properties and tends to act merely as a support for the film. One potentially fruitful area of heteroepitaxial study is that of epitaxial LED material deposited on silicon substrates, primarily because of the wide availability of large area, high quality and relatively low cost silicon substrates. A series of different deposition processes have been attempted to achieve monolithic integration of GaP LED's on silicon substrates.

The halide transport process [Ga-PCl$_3$-(88% H$_2$, 12 % H$_2$)] was used by Kesperis et al and reported June, 1964 [Technical Report ECOM-2471, "Research on Heterojunctions", U.S. Army Electronics Command]. Difficulties, mainly due to the formation of SiO$_2$ on the silicon substrate, were experienced. The typical growth temperature was 700°–750°C and the utilization of slow growth rates, on the order of 0.7 $\mu$/min. were found to retard film cracking in layers up to 22 $\mu$ thick. A slightly different halide transport system, employing GaP and PCl$_3$ as the source materials, has been recently reported by Huber and Winstel ["Growth of Heteroepitaxial GaP on Si Substrates by a Chloride Transport Process", Siemens Forsch-n. Entwickl - Ber. Bd 2(1973), No. 3]. This research also experienced deposition difficulties due to the presence of oxide on the silicon substrates and successful depositions, at about 800°–850°C, were achieved on <110> substrates but not on <100> substrates provided the silicon substates underwent a specific high temperature H$_2$ bake cycle.

The use of a close spaced evaporation technique has been disclosed by Igarashi ["Heteroepitaxial Growth of GaP and Si Substrates by Evaporation Method", J. Applied Physics 41, 3190 (1970); "Selective Growth of Heteroepitaxial GaP on Si Substrates", J. Electrochem Soc., Vol. 119, p. 1430, (1972)]. Depositions into SiO$_2$ holes (about 70 × 200 $\mu$) were crack free, so long as the depositions were less than 5 $\mu$ thickness. Also, Thomas ]"Growth of Single Crystal GaP from Organometallic Sources", J. Electrochem Soc., Vol. 116, No. 10, p. 1449 (1969)] has reported on the pyrolysis technique at the lowest reported growth temperature (485°C). However, the growth rate (0.0025 $\mu$/min.) and film thickness (0.5 $\mu$) were of little practical use for GaP diode applications.

Other process methods such as closed tube transport [Hoack and Mohling, "Epitaxial Layers of Gallium Phosphide on Silicon", Phys. Stat. Sol. 3A K229 (1970)], eutectic growth [Rosztoczy and Stein, "The Growth of Ge-GaAs and GaP-Si Heterojunctions by Liquid Phase epitaxy", J. Electrochem Soc., Vol. 119, No. 8, p. 1119 (1972)] and electrolytic depositions [Cuomo and Gambins, "The Synthesis and Epitaxial Growth of GaP by Fused Salt Electrolysis", J. Electrochem Soc., Vol. 115, No. 7 (1967)] have been used to study the GaP on Si heterosystem, but these tend not to lend themselves very readily to any large scale, practical production methods.

Similarly, prior art patents such as Ruerwein, U.S. Pat. No. 3,312,570; LaChapelle, U.S. Pat. No. 3,582,410; and Yu, U.S. Pat. No. 3,366,517 relate to studies for establishing appropriate conditions for achieving heteroepitaxial growths. Very few material characteristics have been reported in the prior art because most material was not suitable for such measurement and analysis. The available data is restricted to commonly observed film cracking along cleavage planes, Hall measurements and cursory structural and optical data. The patent to Mason, U.S. Pat. No. 3,766,447 attempts to overcome the problem of the mismatch between Si and GaP by the use between the two of a graded alloy layer consisting of silicon with a germanium (Ge) concentration ranging from zero at the junction with the Si substrate to about 8% at the junction with the GaP layer. The prior art as represented by Mason moves away from the desired goal of direct epitaxial deposition of an electroluminescent semiconductor on silicon in attempts to achieve a commerically viable product by compromising, in the process, characteristics of the materials to reach a satisfactory result.

SUMMARY OF THE INVENTION

In its simplest terms, the present invention defines a process for the production of epitaxial GaP and GaAsP deposits on Si substrates to be used in the fabrication of LED's. A review of the prior art discussed above indicates that emphasis was placed on the use of either pyrolytic deposition or disproportionation. Individually, these processes are not successful in the formation of adequate epitaxial quality for efficient LED fabrication. In the case of pyrolytic depositions the resulting structural and electrical quality of the material is poor while significant difficulties with film nucleation on the Si substrates exist in the disproportionation system.

To date, only GaAs and GaP wafers have been used as substrates on which epitaxial layers of high quality have been achieved. Preferably, substrates of single crystal silicon are desired because of the cost differences between these crystals and those of GaAs and GaP. Furthermore, the extensive silicon device technology could also be taken advantage of by integrating it with the LED technology. This invention, by the unique combination of two deposition techniques, makes possible the direct growth of good epitaxial quality GaP as well as GaAsP on a Si substrate.

The process of the present invention comprises first pyrolytically depositing GaP [in the range of 0.1 to 10 $\mu$ thick] on a silicon substrate to serve as a primer layer. This process step permits ready nucleation on Si substrates when initiated above 900°C; however, the electrical properties of even thick films produced in this manner are quite inadequate for LED purposes. Accordingly, a second layer of GaP is deposited at 700°–750°C using a standard disproportionation deposition process. The second layer is approximately 10–40 $\mu$ in thickness and this process results in a high quality and relatively large area (~5–6mm²) crack free GaP material useful for LED fabrication.

To produce acceptable LED's of different wavelengths, the growth of the second GaP layer, after an initial 2–5 μ thick deposit, is continued with the band gap altered by the addition of AsH₃ to form GaAsP through the use of an electronic programmed metering device. The AsH₃ content is graded until the design composition of the LED is achieved; it is then maintained at that level for the growth of a constant composition of 10–20 μ.

Accordingly, it is a first object of this invention to provide a process for producing low cost GaP on Si wafers to be used in the making of light emitting diodes.

It is a further object of this invention to provide a reliable and reproducible heteroepitaxial GaP deposition process on silicon substrates.

It is a further object of this invention to provide a heteroepitaxial GaP deposition process that will facilitate the growth of GaAsP on Si by the graded addition of AsH₃ to the growing GaP layer to produce different wavelength emitting LED's.

These and other objects of the present invention are explained in greater detail in the following material.

BRIEF DESCRIPTION OF THE DRAWINGS

FIG. 1 is a block diagram of the process steps used in the invention.

FIGS. 2a and 2b show cross-sectional views of heteroepitaxial GaP/Si and GaAsP/Si arrays produced by the processes of the present invention.

FIG. 3 is a schematic view of apparatus to be used for the pyrolytic growth of GaP on Si in accordance with the first step of this method.

DETAILED DESCRIPTION OF THE PREFERRED EMBODIMENTS

According to the preferred method of practicing this invention shown in the block diagram in FIG. 1, the first step is the pyrolytic deposition of GaP on Si substrates to serve as a "primer". The reaction tube 10, typically quartz about 50mm in diameter, is conventionally positioned horizontally. However, it is used vertically in this process, as shown in FIG. 3, and the inlets consist of two tubes 12, 14. The internal inlet 12 permits entrance of the reactant gases and the external inlet 14 provides an H₂ curtain around the reactant gases to guide them to the deposition area with a minimal amount of excess deposit on the reactor walls. The substrates 16 are placed on an uncoated, high purity graphite pedestal 18 and are heated by an r.f. induction coil 20.

Metering valves M are used to control the flow of reactants, monitored by flow meters F and solenoid valve S to selectively turn on and off the flow of gases. A high temperature H₂ bake cycle of approximately 2 minutes at approximately 1100°C is essential as a precursor to pyrolytic deposition in order to successfully deposit continuous films. The pyrolytic process is then run until an epitaxial film of about 0.1–10 μ is deposited on the substrate. This film is a primed layer on the silicon substrate.

Typical conditions for such a run are presented in the following table:

Flow Rates
H₂ (main flow)     3.0 l/min.
H₂ [Ga(CH₃)₃ pick-up]   3.0 l/min.

-continued

Flow Rates
H₂ (PH₃ pick-up)    2.5 l/min.
Ga(CH₃)₃            25 cc/min.
PH₃                 25 cc/min.

Temperatures

1125°C – 1000°C – 850°C

Times 2 min at 1125°C
3 min at Grade Temperature (1125° → 1000°C)
1 min PH₃ at 1000°C
5 min PH₃ and Ga(CH₃)₃ at 1000°C
15 min PH₃ and Ga(CH₃)₃ at 850°C
8 min Flush The results of such a deposition will be an epitaxy of good quality on either Si <100> or 3° misoriented off the <100> plane, with a film of up to 7.5 μ thick. The basic equations for this pyrolytic process are $$(CH_3)_3 Ga \xrightarrow[H_2]{\Delta} Ga_{(vapor)} + 3CH_4$$

$$PH_3 \xrightarrow{\Delta} 1/x\ P_x + 3/2\ H_2 \quad (x = 1\text{-}4)$$

$$1/x\ P_x + Ga_{(vapor)} \rightarrow GaP_{(solid)}$$

Additionally, it should be noted that to enhance the GaP formation in the region of high temperature, e.g., in the substrate 16 and the susceptor 18 area, a cold walled reactor is used. The final growth temperatures may be varied down to approximately 750°C and still yield acceptable results.

The second step in the preferred embodiment of this invention is to deposit a second layer of GaP to a thickness of approximately 10 – 40 μ using a standard and commercially available HCl/Ga/PH₃/H₂ deposition apparatus. Such device and method are described in Casey, Jr. and Trumbore, "Single Crystal Electroluminescent Materials", Mater. Sci. Eng., 6 (1970) pp. 69–109, and the description need not be recited here. The basic equations for the above process are:

$$HCl + Ga_{(liquid)} \xrightarrow{\Delta} GaCl_{(vapor)}$$

$$PH_3 \xrightarrow{\Delta} 1/x\ P_x + 3/2\ H_2 \quad (x = 1\text{-}4)$$

$$GaCl_{(vapor)} + 1/xP_x + \tfrac{1}{2}H_2 \rightarrow GaP + HCl$$

In such a system, the chamber walls are hot in order to prevent GaP formation on the walls. If the wall is cold, the reaction would occur at the wall rather than in the wafer area. Typical parameters used in this step are:

Flow Rates

H₂ ~1.2 l/min.
HCl ~2 cc/min.
PH₃ ~8 cc/min.

Temperature

700°–750°C

Time

75 – 150 minutes

Growth rates achieved were about 0.1 – 0.2 $\mu$/min. with GaP thickness in the order of 12.6 – 13.3 $\mu$ at 75 minutes and 29.8 $\mu$ at 150 minutes. The resultant processing allows high quality GaP material with relatively large distances (2–3 mils) between cracks. FIG. 2a shows a cross-section of such a structure.

To compare results of the heteroepitaxial GaP/Si films with established standard homoepitaxial GaP/GaP films, a series of comparative tests were run with the following results established:

|  |  | GaP/GaP | GaP/Si |
|---|---|---|---|
| 300°K | Doping level | $4.3 \times 10^{16}$ cm$^3$ | $5.1 \times 10^{16}$ cm$^3$ |
|  | Mobility | 150 cm$^2$/v sec | 150 cm$^2$/v sec |
| 77°K | Doping level | $2.0 \times 10^{14}$ cm$^3$ | $1.8 \times 10^{14}$ cm$^3$ |
|  | Mobility | 1730 cm$^2$/v sec | 1660 cm$^2$/v sec |
| Dislocation Density (D-pits) |  | ~$10^5$/cm$^2$ | Graded from interface (~$10^7$/cm$^2$) To surface region ($10^5$/cm$^2$) |

It is known that etch pit densities of approximately $10^5$/cm$^2$ of the D-pit type have no direct effect on the final electroluminescence of the material and, accordingly, the wafers of GaP/Si are suitable candidates for GaP LED's.

Conventionally, GaAsP layers have been used in the semiconductor industry for producing LED's. The main problem associated with these devices is the cost because only GaP and GaAs could until now be used for substrates. The use of silicon is obviously preferred but due to the lattice mismatch, GaAsP cannot be grown on silicon. It is known that the grading of GaP by the addition of AsH$_3$ can produce GaAsP expitaxial layers suitable for LED's.

Hence, the ability to grow GaP on Si as demonstrated herein makes it feasible to make an LED of GaAsP on Si. Basically, during the disproportionation growth of the second layer of GaP, an electronically programmed flow meter, which is commercially available is employed for controlling the addition of AsH$_3$ to facilitate the growth of any desired band gap GaAsP. The grading of AsH$_3$ is continued until the design composition is achieved; it is then maintained at that composition to form a thick layer (~10–20$\mu$). FIG. 2b shows a cross-section of such a structure.

While the invention has been particularly shown and described with reference to the preferred embodiment, it will be understood by those skilled in the art that various changes in form and detail may be made therein without departing from the spirit and scope of the invention.

What is claimed is:

1. A method of growing gallium phosphide on a silicon substrate comprising the steps of:
   subjecting the silicon substrate to a high temperature bake cycle in the range of 1100°C for approximately 2 minutes;
   pyrolytically depositing a first layer of GaP on Si to form a continuous thin epitaxial film; and
   depositing a second layer of GaP onto the first layer by the halide transport process to form an epitaxial layer of GaP on the GaP primed Si suitable for use in the production of light emitting diodes.

2. The method of claim 1 wherein the first layer is formed by pyrolytic deposition to a thickness in the range of 0.1 – 10 microns.

3. The method of claim 1 wherein the pytolytic deposition takes place in a temperature range of 750°C to 1000°C.

4. The method of claim 1 wherein the second layer is deposited by the halide transport process to a thickness in the range of 10 – 40 microns in thickness on the first layer.

5. The method of claim 1 wherein the deposition by the halide transport process is in the temperature range of 700°–850°C.

6. The method of claim 1 wherein the time deposition of the second layer is in the range of 75 to 150 minutes.

7. A method of making a light emitting diode comprising the steps of:
   pyrolytically depositing a first layer of gallium phosphide on silicon to form a thin epitaxial film;
   depositing a second layer of GaP onto the first layer of GaP by the halide transport process;
   continuing to grow GaP to an appropriate thickness, with the bandgap of the GaP being altered by the addition of AsH$_3$;
   grading the AsH$_3$ content until a constant composition layer of GaAsP is achieved to the appropriate LED wavelength and maintaining the composition to grow an appropriate thickness.

8. The method of claim 7 wherein the silicon substrate is first subjected to a high temperature bake cycle in the range of 1100°C for approximately 2 minutes.

9. The method of claim 7 wherein the first layer is formed by pyrolytic deposition to a thickness in the range of 0.1 – 10 microns in thickness.

10. The method of claim 7 wherein the deposition by the halide transport process is in a temperature range of 700°–850°C.

11. A method of growing gallium phosphide on a silicon substrate consisting of the steps of:
   pyrolytically depositing a first layer of GaP on Si to form a continuous thin epitaxial film;
   depositing a second layer of GaP onto the first layer by the halide transport process to form an epitaxial layer of GaP on the Gap primed Si suitable for use in the production of light emitting diodes.

12. The method of claim 11 wherein the first layer is formed by pyrolytic deposition to a thickness in the range of 0.1 – 10 microns.

13. The method of claim 11 wherein the pyrolytic deposition takes place in a temperature range of 750°C to 1000°C.

14. The method of claim 11 wherein the second layer is deposited by the halide transport process to a thickness in the range of 10–40 microns in thickness on the first layer.

15. The method of claim 11 wherein the deposition by the halide transport process is in the temperature range of 700°–850°C.

16. The method of claim 11 wherein the time of deposition of the second layer is in the range of 75 to 150 minutes.

* * * * *

UNITED STATES PATENT AND TRADEMARK OFFICE
CERTIFICATE OF CORRECTION

PATENT NO. : 3,963,538
DATED : June 15, 1976
INVENTOR(S) : Robert W. Broadie et al It is certified that error appears in the above-identified patent and that said Letters Patent are hereby corrected as shown below:

Column 1, line 48, delete "substates" and insert --substrates--;

line 58, delete "]" and insert --[--.

Column 3, line 28, delete "the" and insert --this--.

IN THE CLAIMS:

Column 6, line 16, following "time" insert --of--;

line 47, after "on the", delete "Gap" and insert --GaP--.

Signed and Sealed this

Fifteenth Day of March 1977

[SEAL]

Attest:

RUTH C. MASON
Attesting Officer

C. MARSHALL DANN
Commissioner of Patents and Trademarks